(12) United States Patent
Takemiya et al.

(10) Patent No.: US 6,372,351 B1
(45) Date of Patent: Apr. 16, 2002

(54) ENCAPSULANT EPOXY RESIN COMPOSITION AND ELECTRONIC DEVICE

(75) Inventors: Keizo Takemiya; Hidenori Abe, both of Ibaraki-ken (JP)

(73) Assignee: Hitachi Chemical Company, Ltd., Tokyo (JP)

(*) Notice: Subject to any disclaimer, the term of this patent is extended or adjusted under 35 U.S.C. 154(b) by 0 days.

(21) Appl. No.: 09/549,708

(22) Filed: Apr. 14, 2000

(30) Foreign Application Priority Data

Sep. 17, 1999 (JP) .............................. 11-263856
Mar. 21, 2000 (JP) .......................... 2000-083233

(51) Int. Cl.⁷ ............................................... B32B 27/38
(52) U.S. Cl. ..................... 428/416; 428/620; 523/468; 523/440
(58) Field of Search ................................ 523/440, 468; 428/620, 416; 257/789, 795

(56) References Cited

FOREIGN PATENT DOCUMENTS

| JP | 63179921 | | 7/1988 |
| JP | 11060904 | | 3/1999 |
| RU | 306161 | * | 6/1971 |

* cited by examiner

Primary Examiner—Robert Dawson
Assistant Examiner—D. Aylward
(74) Attorney, Agent, or Firm—Antonelli, Terry, Stout & Kraus, LLP

(57) ABSTRACT

In the present invention, provided are i) an encapsulant epoxy resin composition comprising an epoxy resin, a curing agent, a non-conductive carbon and an inorganic filler, and ii) an electronic device having an encapsulating member comprising a cured product of this composition.

14 Claims, 1 Drawing Sheet

ENCAPSULANT EPOXY RESIN COMPOSITION AND ELECTRONIC DEVICE

This application is based on Japanese Patent Applications No. 11-263856 and No. 2000-83233 filed in Japan, the contents of which are incorporated hereinto by reference.

BACKGROUND OF THE INVENTION

1. Field of the Invention

This invention relates to an encapsulant epoxy resin composition having superior laser markability, electrical properties, moldability, reliability and package surface appearance, and an electronic device having device components encapsulated with this composition.

2. Description of Related Art

With an improvement in integration of semiconductor device components such as ICs (integrated circuits) and LSIs (large-scale integrated circuits), device components are being made larger in its occupying area to a package and electronic devices such as semiconductor devices are being made smaller, thinner and more multiple-pin. Also, as electronic instruments are being made smaller in size and thickness, packaging methods have changed correspondingly, where the surface mount, which enables high-density packaging, has come into wide use rapidly in place of pin-insert type. In this surface mount, when electronic devices are mounted to a substrate, the electronic device themselves are exposed to a high temperature in a short time through the step of soldering at 200° C. or above. At this time, the moisture contained in an encapsulant vaporizes and the vapor pressure thereby produced acts as a peel stress at the interface between the encapsulant and the device components or insert such as a lead frame to cause separation of the encapsulant from the insert at their interface. Especially in thin-type electronic devices, this leads to the occurrence of blistering or cracking of the electronic devices.

As measures for preventing the blistering or cracking caused by such separation, used are a method in which a coat material is applied on the device surface or the back of islands of a lead frame so as to improve its adhesion to the encapsulant, a method in which dimples or slits are formed on the back of islands of a lead frame, and a method in which a package is set up in LOC (lead on chip) structure so as to improve the adhesion to the encapsulant. These methods, however, have the problems that a high cost may result and no satisfactory effect can be attained. In addition, when the LOC structure is employed, the package surface may have a color non-uniformity to spoil surface appearance.

As another problem, the pitch between inner leads, between pads and between wires are being made narrower as electronic devices such as semiconductor devices are made smaller in size and more multiple-pin. Hence, where any conductive substance such as carbon black is present as large coarse particles in the encapsulant, such conductive particles may lie between inner leads, between pads, between wires or the like to cause faulty electrical characteristics. Accordingly, studies are made on using as colorants organic dyes, pigments or the like in place of carbon black (Japanese Patent Applications Laid-open KOKAI No. 63-179921 and No. 11-60904). These colorants, however, have problems of, e.g., a low YAG (yttrium aluminium garnet) laser markability, a low reliability and a high cost.

SUMMARY OF THE INVENTION

An object of the present invention is to provide an encapsulant epoxy resin composition having a superior moldability, that has superior laser markability and electrical properties, does not cause any short circuit due to conductive substances even in electronic devices such as semiconductor devices having narrow pitches between pads or between wires, and can obtain highly reliable packages without spoiling package surface appearance; and an electronic device having device components encapsulated with such a composition.

As a result of extensive studies, the present inventors have discovered that the above object can be achieved by mixing in an encapsulant epoxy resin composition a non-conductive carbon. Thus, they have accomplished the present invention.

The present invention provides an encapsulant epoxy resin composition comprising an epoxy resin, a curing agent, a non-conductive carbon and an inorganic filler. In the present invention, it is preferable to use a non-conductive carbon having an electrical resistance of $10^7$ Ω or above, and is preferable for the non-conductive carbon to be contained in an amount of from 0.1 to 10% by weight based on the total weight of the encapsulant epoxy resin composition.

The encapsulant epoxy resin composition has a good moldability and has a superior laser markability. Hence, using this composition, an electronic device having superior electrical properties, reliability and package surface appearance can be obtained. Accordingly, the present invention also provides an electronic device having an encapsulating member comprising a cured product of this encapsulant epoxy resin composition.

DETAILED DESCRIPTION OF THE INVENTION

Figure 1:
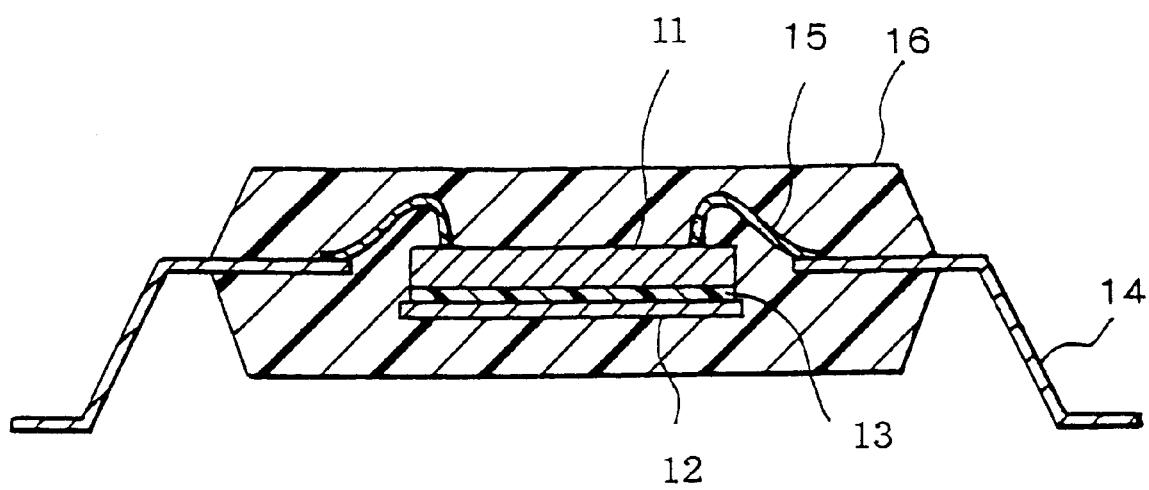
FIG. 1 are cross-sectional illustrations of an example of a resin-encapsulated semiconductor device.

1. Constituents of Encapsulant Epoxy Resin Composition

The encapsulant epoxy resin composition of the present invention comprises an epoxy resin, a curing agent, a non-conductive carbon and an inorganic filler. The respective constituents will be described below.

(1) Epoxy Resin

There are no particular limitations on the epoxy resin used in the present invention. Those commonly used in encapsulant epoxy resin compositions may appropriately be selected. Epoxy resins usable in the present invention may include, e.g.;

- epoxy resins obtained by the epoxidation of novolak resins synthesized from phenols and aldehydes, as exemplified by phenol novolak type epoxy resins, orthocresol novolak type epoxy resins and bisphenol-A novolak type epoxy resins;
- alkyl-substituted or unsubstituted biphenol type epoxy resins;
- alkyl-substituted or unsubstituted glycidyl ether type epoxy resins;
- glycidylamine type epoxy resins obtained by the reaction of polyamines such as isocyanuric acid with epichlorohydrin;

biphenyl type epoxy resins;

epoxidized products of co-condensation resins of dicyclopentadiene with phenols and/or naphthols;

epoxy resins having a naphthalene ring;

epoxidized products of aralkyl type phenolic resins as exemplified by phenol-aralkyl resins and naphthol-aralkyl resins;

trimethylolpropane type epoxy resins;

terpene-modified epoxy resins; and linear aliphatic epoxy resins and alicyclic epoxy resins, obtained by the oxidation of olefinic bonds with peracids such as peracetic acid. Any of these may be used alone or in combination of two or more types.

Stated specifically, the epoxy resin may include compounds represented by any of the following Formulas (I) to (IV).

stituted monovalent hydrocarbon group having 1 to 10 carbon atoms, and may all be the same or at least one may be different; and n represents an integer of 0 to 10.

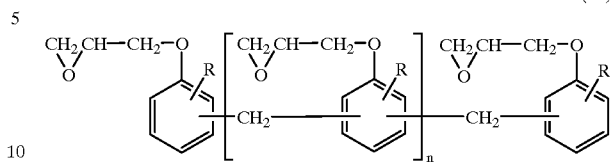

(IV)

wherein R's are each selected from the group consisting of a hydrogen atom and a substituted or unsubstituted monovalent hydrocarbon group having 1 to 10 carbon atoms; and n represents an integer of 0 to 10.

The groups represented by $R^1$ to $R^4$ in the above Formula (I) are selected from the group consisting of substituted or

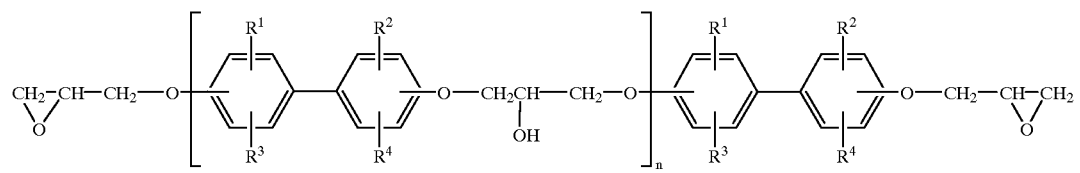

(I)

wherein $R^1$ to $R^4$ are each selected from the group consisting of a hydrogen atom and a substituted or unsubstituted monovalent hydrocarbon group having 1 to 10 carbon atoms, and may all be the same or at least one may be different; and n represents an integer of 0 to 3.

unsubstituted monovalent hydrocarbon groups having 1 to 10 carbon atoms, as exemplified by;

alkyl groups such as a methyl group, an ethyl group, a propyl group, a butyl group, an isopropyl group and an isobutyl group;

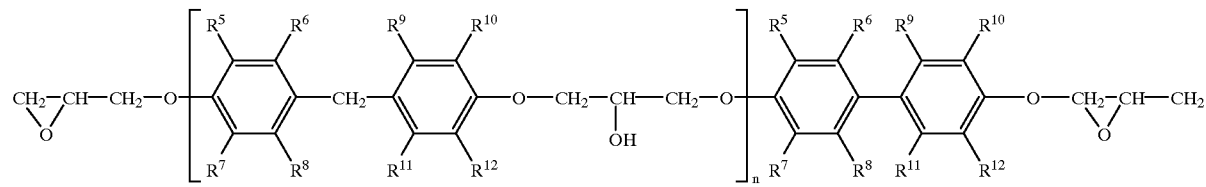

(II)

wherein $R^5$ to $R^{12}$ are each selected from the group consisting of a hydrogen atom and a substituted or unsubstituted monovalent hydrocarbon group having 1 to 10 carbon atoms, and may all be the same or at least one may be different; and n represents an integer of 0 to 3.

alkoxyl groups such as a methoxyl group, an ethoxyl group, a propoxyl group and a butoxyl group;

aryl groups such as a phenyl group, a tolyl group and xylyl group;

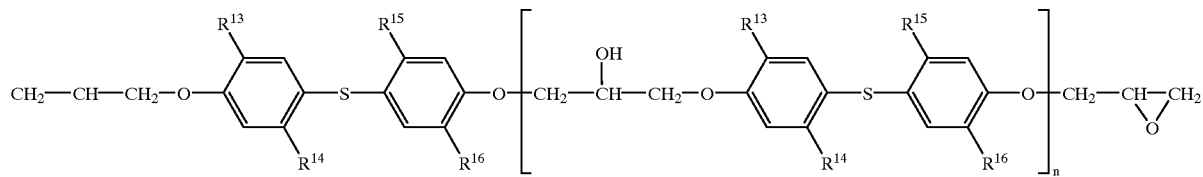

(III)

wherein $R^{13}$ to $R^{16}$ are each selected from the group consisting of a hydrogen atom and a substituted or unsubaralkyl groups such as a benzyl group and a phenethyl group;

alkoxyalkyl groups such as a methoxymethyl group, an ethoxymethyl group and a methoxyethyl group; and amino-group-substituted alkyl groups such as an aminomethyl group and an aminoethyl group;

and a hydrogen atom. Of these, a hydrogen atom or a methyl group are preferred.

Such biphenyl type epoxy resins represented by Formula (I) may include;

epoxy resins composed chiefly of 4,4'-bis(2,3-epoxypropoxy)biphenyl or 4,4'-bis(2,3-epoxypropoxy)-3,3',5,5'-tetramethylbiphenyl; and epoxy resins obtained by the reaction of 4,4'-biphenol or 4,4'-(3,3',5,5'-tetramethyl)biphenol with epichlorohydrin. In particular, epoxy resins composed chiefly of 4,4'-bis(2,3-epoxypropoxy)-3,3',5,5'-tetramethylbiphenyl are preferred.

The groups represented by $R^5$ to $R^{12}$ in the above Formula (II) are selected from the group consisting of substituted or unsubstituted monovalent hydrocarbon groups having 1 to 10 carbon atoms, as exemplified by;

alkyl groups such as a methyl group, an ethyl group, a propyl group, a butyl group, an isopropyl group and an isobutyl group;

alkoxyl groups such as a methoxyl group, an ethoxyl group, a propoxyl group and a butoxyl group;

aryl groups such as a phenyl group, a tolyl group and xylyl group;

aralkyl groups such as a benzyl group and a phenethyl group;

alkoxyalkyl groups such as a methoxymethyl group, an ethoxymethyl group and a methoxyethyl group; and amino-group-substituted alkyl groups such as an aminomethyl group and an aminoethyl group;

and a hydrogen atom. Of these, a hydrogen atom or a methyl group are preferred.

Such bisphenol-F type epoxy resins represented by Formula (II) are exemplified by a resin commercially available as ESLV-80XY (trade name; available from Nippon Steel Chemical Co., Ltd.), composed chiefly of a compound in which $R^5$, $R^7$, $R^{10}$ and $R^{12}$ are methyl groups, $R^6$, $R^8$, $R^9$ and $R^{11}$ are hydrogen atoms and n is 0.

The groups represented by $R^{13}$ to $R^{16}$ in the above Formula (III) are selected from the group consisting of substituted or unsubstituted monovalent hydrocarbon groups having 1 to 10 carbon atoms, as exemplified by;

alkyl groups such as a methyl group, an ethyl group, a propyl group, an isopropyl group, a n-butyl group, a t-butyl group, an amyl group and an isobutyl group;

alkoxyl groups such as a methoxyl group, an ethoxyl group, a propoxyl group and a butoxyl group;

aryl groups such as a phenyl group, a tolyl group and xylyl group;

aralkyl groups such as a benzyl group and a phenethyl group;

alkoxyalkyl groups such as a methoxymethyl group, an ethoxymethyl group and a methoxyethyl group; and amino-group-substituted alkyl groups such as an aminomethyl group and an aminoethyl group;

and a hydrogen atom. Of these, alkyl groups are preferred, and a methyl group or a t-butyl group is more preferred.

From the viewpoint of availability and flowability, such phenyl sulfide type epoxy resins represented by Formula (III) may preferably be epoxidized products of bis(2-methyl-4-hydroxy-5-t-butyl)thioether, composed chiefly of a compound in which $R^{13}$ and $R^{16}$ are t-butyl groups, $R^{14}$ and $R^{15}$ are methyl groups and n is 0.

The groups represented by R in the above Formula (IV) are selected from the group consisting of substituted or unsubstituted monovalent hydrocarbon groups having 1 to 10 carbon atoms, as exemplified by;

alkyl groups such as a methyl group, an ethyl group, a propyl group, a butyl group, an isopropyl group and a t-butyl group;

alkenyl groups such as a vinyl group, an allyl group and a butenyl group;

alkyl halide groups;

amino-group-substituted alkyl groups; and mercapto-group-substituted alkyl groups;

and a hydrogen atom. Of these, alkyl groups such as a methyl group and an ethyl group are preferred, and a methyl group is more preferred.

Such novolak type epoxy resins represented by Formula (IV) may preferably include phenol novolak type epoxy resins and orthocresol novolak type epoxy resins. In particular, orthocresol novolak type epoxy resins are preferred.

(2) Curing Agent

There are no particular limitations on the curing agent used in the present invention. Those commonly used in encapsulant epoxy resin compositions may appropriately be selected. Curing agents usable in the present invention may include;

resins obtained by the condensation or co-condensation of phenols (e.g., phenol, cresol, resorcin, catechol, bisphenol A and bisphenol F) and/or naphthols (e.g., α-naphthol, β-naphthol and dihydroxynaphthalene) with aldehydes such as formaldehyde in the presence of an acid catalyst; and aralkyl type phenolic resins (e.g., phenol-aralkyl resins and naphthol-aralkyl resins). Any of these may be used alone or in combination of two or more types.

The curing agent may preferably be mixed in such an amount that the equivalent weight of phenolic hydroxyl groups is from 0.5 to 1.5 equivalent weight, and more preferably from 0.8 to 1.2 equivalent weight, with respect to the equivalent weight of epoxy groups of the epoxy resin. If it is less than 0.5 equivalent weight, the epoxy resin may cure insufficiently to tend to make the cured product have poor heat resistance, moisture resistance and electrical properties. If it is more than 1.5 equivalent weight, the curing agent constituent is present in excess, so that the phenolic hydroxyl groups may remain in a large quantity in the cured-product resin to tend to make its electrical properties and moisture resistance poor.

(3) Curing Accelerator

The encapsulant epoxy resin composition of the present invention may preferably be mixed with a curing accelerator in order to accelerate the etherification reaction of epoxy groups with phenolic hydroxyl groups. There are no particular limitations on the curing accelerator as long as it is a compound having the catalytic function that may accelerate the reaction of the epoxy resin with the curing agent. It may include, e.g.;

tertiary amines such as 1,8-diazabicyclo[5.4.0]undecene-7, 1,5-diazabicyclo[4.3.0]nonene, 5,6-dibutylamino-1,8-diazabicyclo[5.4.0]undecene-7, benzyldimethylamine, triethanolamine, dimethylaminoethanol and tris(dimethylaminomethyl)phenol, and derivatives of these;

imidazoles such as 2-methylimidazole, 2-phenylimidazole and 2-phenyl-4-methylimidazole, and derivatives of these;

organophosphines such as tributylphosphine, methyldiphenylphosphine, triphenylphosphine, diphenylphosphine and phenylphosphine;

phosphorus compounds having intramolecular polarization, comprising any of the above organophosphines to which a compound having a π-bond such as maleic anhydride, benzoquinone or diazophenylmethane has been added; and tetraphenylphosphonium tetraphenylborate, triphenylphosphine tetraphenylborate, 2-ethyl-4-methylimidazole tetraphenylborate, N-methyltetraphenylphosphonium tetraphenylborate, and triphenylphosphonium triphenylborane. Any of these may be used alone or in combination of two or more types.

The curing accelerator may preferably be mixed in an amount of from 0.01 to 5 parts by weight, and more preferably from 0.1 to 3 parts by weight, based on 100 parts by weight of the epoxy resin. If it is less than 0.01 part by weight, it may provide a low acceleration effect. If it is more than 5% by weight, the resultant composition tends to have a poor storage stability.

(4) Non-conductive Carbon

The non-conductive carbon used in the present invention may include, e.g., but not particularly limited to;

non-conductive polymer-baked carbon obtained by baking a polymer;

graft carbon obtained by grafting a polymer onto the particle surfaces of carbon black;

a carbon-included filler obtained by covering particle surfaces of carbon black with an insulating inorganic matter such as silica; and carbon black having been subjected to surface treatment (e.g., oxidation treatment). Any of these may be used alone or in combination of two or more types. Non-conductive carbon coated with epoxy resin, phenolic resin or the like may also be used.

i) Production of Non-conductive Carbon

There are no particular limitations on how to produce the non-conductive polymer-baked carbon. For example, it may be produced by baking at 400 to 600° C. a polymer such as a sulfonic acid polymer having an aromatic such as naphthalene.

There are no particular limitations on how to produce the graft carbon. For example, it may be produced by subjecting a graft polymer having a group capable of reacting with carboxyl groups of carbon black particle surfaces, such as an epoxy group, a thioepoxy group, an aziridine group, an oxazoline group or an isocyanate group, to irreversible addition reaction with carbon black by heat.

There are no particular limitations on the graft polymer used here. It is obtained by subjecting an unsaturated compound having the above reactive group, to copolymerization with a monomer copolymerizable with the compound. Such a polymer may include, e.g., polystyrene, polyethylene glycol, polyoxazoline, polypropylene glycol, polymethyl methacrylate, acrylic resins, fluorine resins, and derivatives of these, as well as silicones such as polydimethylsiloxane, and waxes. Any of these may be used alone or in combination of two or more types.

There are no particular limitations on the carbon black used for the production of the graft carbon. It may preferably be carbon black at the particle surfaces of which many acidic functional groups such as carboxyl groups are present which are the reaction sites with the graft polymer, and may more preferably be carbon black having a pH of 7 or below.

The graft carbon may preferably have a graft rate of not less than 30% by weight from the viewpoint of non-conductivity, and more preferably not less than 50% by weight. Herein, the graft rate refers to the proportion of graft polymer occupied in the whole graft carbon.

There are no particular limitations on how to produce the carbon-included filler. For example, it may be produced by hydrolyzing tetraethoxysilane on the particle surfaces of carbon black dispersed in an aqueous solution, to cause fine silica particles to deposit thereon; or adding a silica sol to carbon black dispersed in an aqueous solution, to cause fine silica particles to deposit thereon by a sol-gel process. The insulating inorganic matter with which the particle surfaces of carbon black are covered may include, e.g., but not particularly limited to;

alkaline earth metal carbonates such as calcium carbonates and barium carbonate; alkaline earth metal silicates such as calcium silicates and magnesium silicate; metal oxides such as iron oxide, silica, alumina, copper oxide, cobalt oxide and nickel oxide; and cobalt carbonate, nickel carbonate, basic copper carbonates, aluminum hydroxide, and Direct Black 154 calcium lake; any of which may be used alone or in combination of two or more types.

There are no particular limitations on the carbon black used in the carbon-included filler. It may preferably be carbon black readily wettable to water and being not bulky.

The carbon-included filler may preferably have a carbon inclusion rate of not more than 70% by weight from the viewpoint of non-conductivity, and more preferably not more than 50% by weight. Herein, the carbon inclusion rate refers to the proportion of carbon black occupied in the whole carbon-included filler.

There are no particular limitations on how to make surface treatment for the production of the carbon black having been subjected to surface treatment (surface-treated carbon black). For example, it may be produced by air oxidation; oxidation treatment with an oxidizing agent such as nitric acid, a mixed gas of nitrogen oxide and air, or ozone; and treatment with a silane coupling agent.

ii) Electrical Resistance of Non-conductive Carbon

The non-conductive carbon may preferably have an electrical resistance of $10^7$ Ω or above, and more preferably $10^9$ Ω or above. The electrical resistance is determined in the following way: Using a type-2 comb electrode (copper foil thickness: 35 μm; line width: 0.3 mm; line pitch: 0.3 mm; substrate thickness: 0.95 mm) comprising as a substrate a glass-cloth base material epoxy resin copper-clad laminate MCL-E67 (trade name; available from Hitachi Chemical Co., Ltd.), which is in conformity with JIS Z3197, 0.5 g of a powder sample is fastened with a cellophane tape onto its wiring. Under application of a DC voltage of 500 V, the resistance value after 1 minute is measured with a resistometer (TR8601, manufactured by Takeda Riken Industrial Co., Ltd.).

iii) Average Particle Diameter of Non-conductive Carbon

The non-conductive carbon may preferably have an average particle diameter of from 0.3 to 50 μm, and more preferably from 0.3 to 30 μm. From the viewpoint of laser markability and moldability, it may preferably have an average particle diameter of from 0.3 to 10 μm, and more preferably from 0.3 to 5 μm.

iv) Content of Non-conductive Carbon

The non-conductive carbon may preferably be in a content of from 0.1 to 10% by weight, more preferably from 0.3 to 8% by weight, and still more preferably from 0.5 to 4% by weight, based on the total weight of the encapsulant epoxy resin composition. If it is less than 0.1% by weight, the package surface appearance may be spoiled, or insufficient light-screening and laser markability may result. If it is more than 10% by weight, an insufficient moldability may result.

(5) Filler

As a filler, an inorganic filler must be used from the viewpoint of reducing moisture absorption and improving strength.

There are no particular limitations on the inorganic filler used in the present invention. Those commonly used in encapsulant epoxy resin compositions may appropriately be selected. Inorganic fillers usable in the present invention may include;

powders of fused silica, crystalline silica, alumina, zircon, calcium silicate, calcium carbonate, silicon carbide, boron nitride, beryllia and zirconia, or beads of any of these made spherical; and single-crystal fibers of potassium titanate, silicon carbide, silicon nitride and alumina, or glass fibers. Inorganic fillers having a flame-retardant effect may also be used, as exemplified by aluminum hydroxide and zinc borate. Any of these may be used alone or in combination of two or more types.

Of these, fused silica is preferred from the viewpoint of reducing the coefficient of linear expansion, and alumina from the viewpoint of high thermal conductivity. The inorganic filler may preferably have a spherical particle shape from the viewpoint of flowability and mold wear resistance at the time of molding.

The inorganic filler may preferably be mixed in an amount set to be from 70 to 98% by weight, and more preferably from 75 to 95% by weight, based on the total weight of the encapsulant epoxy resin composition from the viewpoint of reducing moisture absorption and the coefficient of linear expansion, improving strength and ensuring soldering heat resistance.

(6) Coupling Agent

To the encapsulant epoxy resin composition of the present invention, a coupling agent may preferably be added from the viewpoint of achieving the affinity of the inorganic filler for the resin constituent.

There are no particular limitations on the coupling agent used in the present invention. Those commonly used in encapsulant epoxy resin compositions may appropriately be selected. Coupling agents usable in the present invention may include;

silane type coupling agents such as vinyltrichlorosilane, vinyltriethoxysilane, vinyltris(β-methoxyethoxy)silane, γ-methacryloxypropyltrimethoxysilane, β-(3,4-epoxydicyclohexyl)ethyltrimethoxysilane, γ-glycidoxypropyltrimethoxysilane, vinyltriacetoxysilane, γ-mercaptopropyltrimethoxysilane, γ-aminopropyltriethoxysilane, γ-[bis (β-hydroxyethyl)] aminopropyltriethoxysilane, N-β-(aminoethyl)-γ-aminopropyltrimethoxysilane, γ-(β-aminoethyl) aminopropyldimethoxymethylsilane, N-(trimethoxysilylpropyl)ethylenediamine, N-(dimethoxysilylisopropyl)ethylenediamine, methyltrimethoxysilane, methyltriethoxysilane, N-β-(N-vinylbenzylaminoethyl)-γ-aminopropyltrimethoxysilane, γ-chloropropyltrimethoxysilane, hexamethyldisilane, γ-anilinopropyltrimethoxysilane, vinyltrimethoxysilane and γ-mercaptopropylmethyldimethoxysilane; and titanate type coupling agents such as isopropyltriisostearoyl titanate, isopropyltris(dioctyl pyrophosphate) titanate, isopropyltri(N-aminoethyl-aminoethyl) titanate, tetraoctylbis(ditridecyl phosphite) titanate, tetra(2,2-diallyloxymethyl-1-butyl)bis(ditridecyl) phosphite titanate, bis(dioctyl pyrophosphate) oxyacetate titanate, bis(dioctyl pyrophosphate) ethylene titanate, isopropyltrioctanoyl titanate, isopropyldimethacrylisostearoyl titanate, isopropyltridodecylbenzenesulfonyl titanate, isopropylisostearoyldiacryl titanate, isopropyltri(dioctyl phosphate) titanate, isopropyltricumylphenyl titanate and tetraisopropylbis (dioctyl phosphite) titanate. Any of these may be used alone or in combination of two or more types.

(7) Other Additives

A release agent such as a higher fatty acid (e.g., carnauba wax and a polyethylene type wax), a modifier such as silicone oil or silicone rubber, an ion trapper such as hydrotalcite or antimony-bismuth and so forth may optionally be mixed as other additives. Any of these may be used alone or in combination of two or more types.

In the encapsulant epoxy resin composition of the present invention, in addition to the above non-conductive carbon, at least one of colorants may further be used in combination as long as they are within the scope where the effect of the present invention is achievable; the colorants being exemplified by azine dyes, anthraquinone dyes, disazo dyes, diiminium dyes, aminium dyes, diimonium dyes, Cr complexes, Fe complexes, Co complexes, Ni complexes, Fe, Cu, Ni and the like metal compounds, Al, Mg, Fe and the like metal oxides, mica, near-infrared absorbers, phthalocyanine pigments, phthalocyanine dyes and carbon black. In particular, phthalocyanine dyes may preferably be used in combination in view of laser markability, flowability and curability.

When conductive particles such as carbon black are used in combination, in order to achieve the object of the present invention, those having a specific surface area of 130 $m^2/g$ or smaller and a DBP oil absorption of 120 $cm^3/100$ g or less may preferably be used and those having a specific surface area of 100 $m^2/g$ or smaller and a DBP oil absorption of 80 $cm^3/100$ g or less may more preferably be used, as having a good dispersibility.

2. Production of Encapsulant Epoxy Resin Composition

The encapsulant epoxy resin composition of the present invention may be prepared by any methods as long as the respective constituent materials can uniformly be dispersed and mixed. As a commonly available method, a method may be used in which stated amounts of the constituent materials are thoroughly mixed by means of a mixer and thereafter melt-kneaded by means of a heat roller an extruder, followed by cooling and pulverization. The product obtained may be made into tablets in such a size and weight that may suit to molding conditions, so as to be usable with ease.

3. Electronic Device

The encapsulant epoxy resin composition of the present invention has superior laser markability, electrical properties, moldability and reliability and also a high skelton preventive effect, and hence is suitable to the encapsulation of device components such as ICs and LSIs. Accordingly, the present invention provides an electronic device encapsulated with the encapsulant epoxy resin composition of the present invention, i.e., an electronic device having an encapsulating member comprising a cured product of the encapsulant epoxy resin composition of the present invention.

The electronic device of the present invention may include electronic devices comprising a support member (e.g., a lead frame, a wired tape carrier, a wiring board, a glass sheet or a silicon wafer), and mounted thereon a component or components (e.g., active components such as a semiconductor chip, a transistor, a diode and a thyristor and passive components such as a capacitor, a resistor and a coil) the necessary part of which has been encapsulated with the encapsulant epoxy resin composition of the present invention.

Such electronic devices may include, e.g.;

commonly available resin-encapsulated ICs such as DIP (dual-inline package), PLCC (plastic-leaded chip carrier), QFP (quad flat package), SOP (small outline package), SOJ (small outline J-lead package), TSOP (thin small outline package) and TQFP (thin quad flat package) in which semiconductor components are fastened onto a lead frame, and terminals (e.g. bonding pads) and leads of each device component are connected by wire bonding or through bumps, followed by encapsulation with the encapsulant epoxy resin composition of the present invention by transfer molding or the like;

TCPs (tape carrier packages) in which semiconductor chips bonded to a tape carrier through bumps are encapsulated with the encapsulant epoxy resin composition of the present invention;

COB (chip-on-board) modules, hybrid ICs and multichip modules in which device components (including active components such as a semiconductor chip, a transistor, a diode and a thyristor and/or passive components such as a capacitor, a resistor and a coil) are bonded to wirings formed on a wiring board or glass sheet, by wire bonding, flip-chip bonding or soldering, and the device components thus bonded are encapsulated with the encapsulant epoxy resin composition of the present invention; and BGAs (ball grid arrays) and CSPs (chip size packages) in which device components are mounted on a surface of an organic substrate on the back of which terminals for wiring-board connection have been formed, and the device components are connected to wirings formed on the organic substrate by wire bonding or through bumps, followed by encapsulation of the device components with the encapsulant composition of the present invention. The encapsulant epoxy resin composition of the present invention is also effectively usable to printed circuit boards.

As methods for encapsulating electronic devices by the use of the encapsulant epoxy resin composition of the present invention, low-pressure transfer molding is most commonly used. Injection molding, compression molding or casting may also be used.

THE PREFERRED EMBODIMENT

The present invention will be described below in greater detail by giving Examples. The present invention is by no means limited to these.

1. Preparation of Encapsulant Epoxy Resin Composition

First, mixing ingredients shown in Tables 1 and 2 were premixed by dry blending, and the mixture obtained was kneaded for 10 minutes by means of a twin-roll mill (roll surface temperature: 80°C.), followed by cooling and pulverization to produce encapsulant epoxy resin compositions of Examples and Comparative Examples.

TABLE 1

Mixing Formulation 1
Amount: part(s) by weight

| Mixing ingredients | Example | | | | | | | | |
|---|---|---|---|---|---|---|---|---|---|
| | 1 | 2 | 3 | 4 | 5 | 6 | 7 | 8 | 9 |
| Biphenyl type epoxy resin | 85.0 | 85.0 | 85.0 | 85.0 | 85.0 | 85.0 | 85.0 | 85.0 | 85.0 |
| Brominated epoxy resin | 15.0 | 15.0 | 15.0 | 15.0 | 15.0 | 15.0 | 15.0 | 15.0 | 15.0 |
| Aralkyl type phenolic resin | 87.0 | 87.0 | 87.0 | 87.0 | 87.0 | 87.0 | 87.0 | 87.0 | 87.0 |
| Triphenylphosphine | 3.0 | 3.0 | 3.0 | 3.0 | 3.0 | 3.0 | 3.0 | 3.0 | 3.0 |
| Epoxysilane | 7.6 | 7.6 | 7.6 | 7.6 | 7.6 | 7.6 | 7.6 | 7.6 | 7.6 |
| Carnauba wax | 1.5 | 1.5 | 1.5 | 1.5 | 1.5 | 1.5 | 1.5 | 1.5 | 1.5 |
| Polyethylene wax | 1.5 | 1.5 | 1.5 | 1.5 | 1.5 | 1.5 | 1.5 | 1.5 | 1.5 |
| Non-conductive carbon A | 55.0 | — | — | 20.0 | 20.0 | 10.0 | — | — | 30.0 |
| Non-conductive carbon B | — | 60.0 | — | — | 30.0 | 20.0 | — | — | — |
| Non-conductive carbon C | — | — | 65.0 | — | — | 30.0 | — | — | — |
| Non-conductive carbon D | — | — | — | — | — | — | 50.0 | — | — |
| Non-conductive carbon E | — | — | — | — | — | — | — | 30.0 | — |
| Carbon black A | — | — | — | 2.0 | — | — | — | — | — |
| Phthalocyanine dye | — | — | — | — | — | — | — | — | 1.0 |
| Antimony trioxide | 12 | 12 | 12 | 12 | 12 | 12 | 12 | 12 | 12 |
| Fused silica | 1550 | 1550 | 1550 | 1550 | 1550 | 1550 | 1550 | 1550 | 1550 |

TABLE 2

Mixing Formulation 2
Amount: part(s) by weight

| Mixing ingredients | Comparative Example | | | |
|---|---|---|---|---|
| | 1 | 2 | 3 | 4 |
| Biphenyl type epoxy resin | 85.0 | 85.0 | 85.0 | 85.0 |
| Brominated epoxy resin | 15.0 | 15.0 | 15.0 | 15.0 |

TABLE 2-continued

Mixing Formulation 2
Amount: part(s) by weight

| | Comparative Example | | | |
|---|---|---|---|---|
| Mixing ingredients | 1 | 2 | 3 | 4 |
| Aralkyl type phenolic resin | 87.0 | 87.0 | 87.0 | 87.0 |
| Triphenylphosphine | 3.0 | 3.0 | 3.0 | 3.0 |
| Epoxysilane | 7.6 | 7.6 | 7.6 | 7.6 |
| Carnauba wax | 1.5 | 1.5 | 1.5 | 1.5 |
| Polyethylene wax | 1.5 | 1.5 | 1.5 | 0.5 |
| Carbon black B | 3.5 | 1.5 | — | — |
| Azine dye | — | 10.0 | 35.0 | — |
| Mica-black iron oxide pigment | — | — | — | 30.0 |
| Antimony trioxide | 12 | 12 | 12 | 15 |
| Fused silica | 1550 | 1550 | 1550 | 1550 |

The mixing ingredients shown in Tables 1 and 2 are as follows:
Biphenyl type epoxy resin: YX-4000H, trade name; available from Yuka Shell Epoxy K.K.)
Brominated epoxy resin: YDB-400, trade name; available from Tohto Kasei Co., LTD
Aralkyl type phenolic resin: XL-225-3L, trade name; available from Mitsui Chemicals Inc.)
Epoxysilane: A-187, trade name; available from Nippon Unicar Co., Ltd.
Polyethylene wax: PED-191, trade name; available from Clariant (Japan) K.K.
Non-conductive carbon A: CB-3-500, trade name; available from Mitsui Mining Co., LTD (average particle diameter: 3 μm; electrical resistance: $10^9$ Ω)
Non-conductive carbon B: CB-7-500, trade name; available from Mitsui Mining Co., LTD (average particle diameter: 7 μm; electrical resistance: $10^9$ Ω)
Non-conductive carbon C: CB-10-500, trade name; available from Mitsui Mining Co., LTD (average particle diameter: 10 μm; electrical resistance: $10^9$ Ω)
Non-conductive carbon D: graft carbon having a graft rate of 90% by weight, making use of a styrene/acrylic graft copolymer (available from Nippon Shokubai Co., Ltd.; electrical resistance: $10^{10}$ Ω)
Non-conductive carbon E: carbon-included silica having a carbon inclusion rate of 17% by weight (available from Suzukiyushi Industrial Co., Ltd.; average particle diameter: 7 μm; electrical resistance: $10^9$ Ω)
Carbon black A: carbon black having a specific surface area of 89 $m^2$/g and a DBP oil absorption of 60 $cm^3$/100 g
Carbon black B: carbon black having a specific surface area of 140 $m^2$/g and a DBP oil absorption of 131 $cm^3$/100 g
Phthalocyanine dye: YKR-3080, trade name; available from Yamamoto Chemicals, Inc.
Azine dye: Spirit Black 920, trade name; available from Sumitomo Chemical Co., Ltd.
Mica-black iron oxide pigment: LS835, trade name; available from Merck Japan Limited
Fused silica: S-CO, trade name; available from Micron corporation 2. Evaluation The encapsulant epoxy resin compositions of the respective Examples and Comparative Examples were evaluated by test methods shown below. The encapsulant epoxy resin compositions were molded using a transfer molding machine and under conditions of a mold temperature of 180° C., a molding pressure of 6.9 MPa and a curing time of 90 seconds. Also, the resultant cured products were post-cured at 175° C. for 6 hours.

(1) Spiral flow
A mold prepared according to EMM11-66 was set in a transfer molding machine and the encapsulant epoxy resin composition was molded under the above conditions, where its flow distance (cm) was determined.

(2) Hot Hardness
A burr measuring mold (a mold provided with slits of 5 mm wide and 50, 30, 20, 10, 5 and 2 μm deep) was set in a transfer molding machine, and the encapsulant epoxy resin composition was molded under the above conditions. Ten seconds after the opening of the mold, the hardness at the resin pools was measured with a Shore hardness meter.

(3) Volume Resistivity
A disk mold was set in a transfer molding machine and the encapsulant epoxy resin composition was molded into a disk of 100 mm diameter and 3 mm thick and post-cured, under the above conditions. Thereafter, its volume resistivity was measured with a volume resistometer at a voltage of 500 V and at 150° C. to ascertain insulating properties.

(4) Moisture Resistance
To evaluate moisture resistance, SOP 28-pin resin-encapsulated semiconductor devices (external dimensions: 18×8.4×2.6 mm) were produced by molding and post-curing each encapsulant epoxy resin composition. These were moistened in an environment of 85° C./85%RH for 72 hours, followed by pre-treatment (IR reflowing) at 240° C. for 10 seconds. Thereafter, whether or not any disconnection of wiring on chips occurred was examined by PCT (pressure cooker test; 121° C./0.2 MPa) to make evaluation by the time by which packages having caused disconnection in the PCT reached 50% of tested packages.

The semiconductor devices for evaluation were produced in the following way. First, a TEG (test element group) chip (Al wiring: 10 and 20 μm wide; gap: 10 and 20 μm; no passivation) with dimensions of 9.6×5.1 mm was fastened with an adhesive onto a lead frame (42 alloy material; dimpled), and the chip was wire-bonded at its bonding pads to the lead frame through gold wires. Thereafter, using each encapsulant epoxy resin composition, transfer molding was carried out under the above conditions, followed by post-curing to form an encapsulating member. Thus, the devices for evaluation were produced.

(5) Soldering Heat Resistance
To evaluate soldering heat resistance, QFP 80-pin resin-encapsulated semiconductor devices (external dimensions: 20×14×2.0 mm) were produced by molding and post-curing each encapsulant epoxy resin composition. These were moistened in an environment of 85° C./85%RH for predetermined hours, followed by IR reflowing at 240° C. for 10 seconds, where their surface appearances were observed to make evaluation by the moisture absorption time by which they caused cracking in surface appearance.

The semiconductor devices for evaluation were produced in the following way. First, as shown in FIG. 1, a testing IC chip 11 with dimensions of 8×10×0.4 mm was fastened with an adhesive 13 onto a die pad (42 alloy material; not worked) 12, and the IC chip 11 was wire-bonded at its bonding pads to the lead 14 (42 alloy material) through gold wires 15. Next, using each encapsulant epoxy resin composition, transfer molding was carried out under the above conditions so as to cover the whole chip 11, to form an encapsulating member 16. Thus, a QFP type semiconductor device shown in FIG. 1 was obtained.

(6) Laser Markability
With regard to laser markability, QFP 54-pin resin-encapsulated semiconductor devices were produced using each encapsulant epoxy resin composition, and letters were printed on the surface of each package by means of a YAG laser marking device under conditions of a YAG laser wavelength of 1,064 nm and a laser power of 5 J. The results of printing were visually observed to evaluate the laser markability.

(7) Electrical Properties

With regard to electrical properties, LQFP (low-profile quad flat package) 176-pin resin-encapsulated semiconductor devices were produced using each encapsulant epoxy resin composition, and whether or not any leakage current flowed was examined to make evaluation.

(8) Blackness

To evaluate blackness, a disk mold was set in a transfer molding machine and the encapsulant epoxy resin composition was molded under the above conditions into a disk of 100 mm diameter and 2 mm thick, having a satin-like surface, followed by post-curing. Thereafter, its color was measured with a color difference meter. The smaller the value of blackness is, the blacker the color is.

3. Evaluation Results

The results of evaluation made by the above tests are shown in Tables 3 and 4.

tory characteristics are obtained. More specifically, Comparative Example 1, which makes use of conductive carbon black, shows inferior electrical properties. Comparative Examples 2 and 3, which make use of an azine dye, show inferior moisture resistance and soldering heat resistance. Comparative Example 4, which makes use of a mica-black iron oxide pigment shows inferior soldering heat resistance and electrical properties.

On the other hand, Examples 1 to 9 show superior reliability such as moisture resistance and soldering heat resistance and superior electrical properties, and also show good laser markability and blackness.

What is claimed is:

1. An encapsulant epoxy resin composition comprising an epoxy resin, a curing agent, an electrically non-conductive carbon colorant and an inorganic filler.

2. The encapsulant epoxy resin composition according to claim 1, wherein said electrically non-conductive carbon colorant has an electrical resistance of $10^7$ Ω or above.

3. The encapsulant epoxy resin composition according to claim 1, wherein said electrically non-conductive carbon colorant is contained in an amount of from 0.1% by weight to 10% by weight based on the total weight of the composition.

TABLE 3

Evaluation Results 1

| Items | Unit | Example 1 | 2 | 3 | 4 | 5 | 6 | 7 | 8 | 9 |
|---|---|---|---|---|---|---|---|---|---|---|
| Spiral flow | cm | 84 | 89 | 94 | 99 | 97 | 94 | 81 | 84 | 94 |
| Hot hardness | — | 80 | 80 | 81 | 80 | 81 | 81 | 80 | 81 | 81 |
| Volume resistivity | Ω·cm | $6 \times 10^{13}$ | $7 \times 10^{13}$ | $6 \times 10^{13}$ | $1 \times 10^{13}$ | $5 \times 10^{13}$ | $4 \times 10^{13}$ | $1 \times 10^{13}$ | $5 \times 10^{13}$ | $4 \times 10^{13}$ |
| Moisture resistance | h | 650 | 650 | 600 | 720 | 600 | 650 | 650 | 600 | 650 |
| Soldering heat resistance | h | 120 | 120 | 120 | 120 | 120 | 120 | 120 | 120 | 120 |
| Laser markability | — | good | good | good | good | good | good | good | good | good |
| Electrical properties (leakage current) | — | no | no | no | no | no | no | no | no | no |
| Blackness | — | 26.4 | 28.9 | 29.5 | 26.5 | 27.6 | 28.7 | 28.2 | 28.3 | 27.9 |
| Overall evaluation | — | ○ | ○ | ○ | ○ | ○ | ○ | ○ | ○ | ○ |

TABLE 4

Evaluation Results 2

| Items | Unit | Comparative Example 1 | 2 | 3 | 4 |
|---|---|---|---|---|---|
| Spiral flow | cm | 97 | 89 | 64 | 76 |
| Hot hardness | — | 81 | 80 | 79 | 80 |
| Volume resistivity | Ω·cm | $3 \times 10^{13}$ | $9 \times 10^{11}$ | $8 \times 10^{11}$ | $8 \times 10^{10}$ |
| Moisture resistance | h | 650 | 310 | 240 | 600 |
| Soldering heat resistance | h | 120 | 96 | 48 | 96 |
| Laser markability | — | good | good | good | good |
| Electrical properties (leakage current) | — | yes | no | no | yes |
| Blackness | — | 27.8 | 28.2 | 28.5 | 28.2 |
| Overall evaluation | — | X | X | X | X |

In all Comparative Examples 1 to 4, which do not make use of any non-conductive carbon as colorants, no satisfac- 4. The encapsulant epoxy resin composition according to claim 2, wherein said electrically non-conductive carbon colorant is contained in an amount of from 0.1% by weight to 10% by weight based on the total weight of the composition.

5. An electronic device having an encapsulating member comprising a cured product of the composition according to claim 1.

6. An electronic device having an encapsulating member comprising a cured product of the composition according to claim 2.

7. The encapsulant epoxy resin composition according to claim 1, wherein the composition further includes at least one additional colorant.

8. The encapsulant epoxy resin composition according to claim 7, wherein said at least one additional colorant includes a phthalocyanine dye.

9. The encapsulant epoxy resin composition according to claim 1, wherein said electrically non-conductive carbon colorant is at least one selected from the group consisting of electrically non-conductive polymer-baked carbon obtained by baking a polymer, graft carbon obtained by grafting a polymer onto particle surfaces of carbon black; a carbon-included filler obtained by covering particle surfaces of carbon black with an insulating inorganic material, and carbon black having been subjected to surface treatment.

10. The encapsulant epoxy resin composition according to claim 2, wherein the electrically non-conductive carbon colorant has an electrical resistance of at least $10^9$ Ω.

11. The encapsulant epoxy resin composition according to claim 1, wherein the electrically non-conductive carbon colorant is in particulate form, having an average particle diameter of from 0.3 to 50 μm.

12. The encapsulant epoxy resin composition according to claim 11, wherein the average particle diameter of the electrically non-conductive carbon colorant particles is 0.3 to 10 μm.

13. An encapsulant epoxy resin composition comprising an epoxy resin, a curing agent, an electrically non-conductive carbon, and, additionally, an inorganic filler.

14. The encapsulant epoxy resin composition according to claim 13, said electrically non-conductive carbon being a colorant in the composition.

* * * * *